United States Patent
Lee et al.

(10) Patent No.: US 6,488,730 B2
(45) Date of Patent: Dec. 3, 2002

(54) POLISHING COMPOSITION

(75) Inventors: Kil Sung Lee, Seoul (KR); Jae Seok Lee, Euiwang-shi (KR); Seok Jin Kim, Seoul (KR); Young Ki Lee, Tajeon-shi (KR); Tu Won Chang, Tajeon-shi (KR)

(73) Assignee: Cheil Industries, Inc., Kyongsang-Pukdo (KR)

( * ) Notice: Subject to any disclaimer, the term of this patent is extended or adjusted under 35 U.S.C. 154(b) by 40 days.

(21) Appl. No.: 09/850,209

(22) Filed: May 7, 2001

(65) Prior Publication Data

US 2002/0022369 A1 Feb. 21, 2002

Related U.S. Application Data

(63) Continuation-in-part of application No. 09/346,062, filed on Jul. 1, 1999, now abandoned.

(51) Int. Cl.⁷ .............................. B24D 3/00; C09K 3/14
(52) U.S. Cl. ........................... 51/307; 51/308; 51/309; 106/3; 216/89; 438/693
(58) Field of Search ................ 106/3; 51/307, 51/308, 309; 216/89; 438/692, 693

(56) References Cited

U.S. PATENT DOCUMENTS

| 4,169,337 A | | 10/1979 | Payne | |
|---|---|---|---|---|
| 5,139,571 A | | 8/1992 | Deal et al. | |
| 5,244,534 A | | 9/1993 | Yu et al. | |
| 5,340,370 A | | 8/1994 | Cadien et al. | |
| 5,352,277 A | * | 10/1994 | Sasaki | 51/308 |
| 5,904,159 A | * | 5/1999 | Kato et al. | 51/308 |

FOREIGN PATENT DOCUMENTS

| EP | 0 786 504 | | 7/1997 |
|---|---|---|---|
| JP | 7-249600 | * | 9/1995 |
| WO | WO 97/40030 | | 10/1997 |

* cited by examiner

*Primary Examiner*—David Brunsman
(74) *Attorney, Agent, or Firm*—Fish & Richardson P.C.

(57) ABSTRACT

The present invention relates to a polishing composition comprising 30 to 99 wt % of deionized water, 0.1 to 50 wt % of powder of metallic oxide and 0.01 to 20 wt % of cyclic amine. This polishing composition can be used in a chemical mechanical polishing of thin films in integrated circuit manufacturing and has an effect of minimizing the occurrence of microscratches on the thin film after polishing. Thereby it can be applied to the manufacturing process of highly integrated circuits such as Shallow Trench Isolation.

4 Claims, No Drawings

POLISHING COMPOSITION

This application is a continuation-in-part of U.S. application Ser. No. 09/346,062, filed Jul. 1, 1999, now abandoned.

BACKGROUND OF THE INVENTION

1. Field of the Invention

The present invention relates to a polishing composition used for polishing of glasses, semiconductors, and integrated circuits. More specifically, the present invention relates to the polishing composition consisting of deionized water, metallic oxide, and cyclic amines for the chemical mechanical polishing of thin films used in integrated circuit manufacturing.

2. Description of the Prior Art

Nowadays, as the densities of Integrated Circuits increase, the global planarization of the intermediate insulating layer has become important. The CMP(Chemical Mecahnical Planarization) in particular has received special attention as a planarization method. Highly integrated semiconductor devices are manufactured by depositing conducting materials between insulating materials alternately to form patterns.

The surface must be flat in order to apply the pattern layer. Without a flat surface making the pattern is impossible.

As the semiconductor devices get more integrated, the minimization of the feature size and multilevel interconnections are needed. Global planarization is one of the most important prerequisites to achieve this.

As the structure of microprocessors and DRAMs become multileveled, problems may occur if the layers upon which the film is deposited are not flat.

In the photolithography process in particular, if we begin the process on an unflattened layer, incident light will reflect diffusely, which will cause a photo resist pattern not to be precise. So we need to planarize the surface by polishing the unnecessarily deposited part.

CMP is the most efficient method that has ever been known. The planarization methods which have been developed, such as SOG/Etch Back/ECR Depo & Etch are very complicated, and require 2–3 steps, but the CMP process can be finished simply by polishing and cleaning.

Conventional polishing compositions, or slurries, for the CMP process generally comprise deionized water, metallic oxide and additives. It can be classified into three kinds according to the materials to be polished.

Which are:

1) Polishing for single crystal silicone
2) Polishing for insulating layer
3) Polishing for metal line and plug The metallic oxide used for this polishing composition can be Silica($SiO_2$), Alumina($Al_2O_3$), Ceria($CeO_2$), Zirconia($ZrO_2$) and Titania($TiO_2$), which are produced by fuming or the Sol-Gel method. The polishing composition also includes acid or base for controlling pH levels as well as an oxidizing agent for improving the removal rate.

Here are some examples for this kind of polishing composition according to the metallic oxides and additives. A slurry consisting of silica and amine used for polishing an insulating layer in the manufacturing of integrated circuits is disclosed in U.S. Pat. No. 4,169,337; a slurry consisting of silica and fourth grade ammonium salt is disclosed in U.S. Pat. No. 5,139,571; a slurry consisting of alumina and $H_2O_2$ used for polishing a metal lines and plugs in integrated circuits manufacturing is disclosed in U.S. Pat. No. 5,244,523; a slurry consisting of silica and $K_3Fe(CN)_6$ is disclosed in U.S. Pat. No. 5,340,370; a slurry consisting of silicon nitride and dicarboxylic acid is disclosed in EP Patent NO 786,504; a slurry consisting of metallic oxide, oxidizing agent, and fluoric ion is disclosed in WO Patent 9,743,070.

These slurries are currently being used for manufacturing semiconductor devices according to the requirements for the CMP process and the materials being polished.

These slurries meet the requirements for removal rate, uniformity, and selectivity, which are needed in the process.

However, their one drawback is that they cause a lot of microscratches on the film surface, and thus need to be improved.

In the CMP process, particularly the Shallow Trench Isolation (STI) process, microscratches lead to a device failure, which is fatal. As, in the STI process, the trench structure is very shallow (200 nm) and minute. Microscratches can cause the disruption of this trench structure, which will affect the transistor or capacitor that will subsequently be made on top of it. Consequently, it is very important to minimize the occurrence of microscratches in the CMP process.

SUMMARY OF THE INVENTION

This invention relates to a polishing composition which is used for polishing in various kinds of industrial processes including semiconductors, photomasks, glassdisks, and synthetic polymers. More specifically it relates to the polishing composition for chemical mechanical polishing of thin films used in a semiconductor integrated circuits.

This polishing composition does not cause any microscratches on the wafer after polishing, so it can be applied to the process of high density integrated circuits manufacturing, such as the STI process.

Microscratches are generated during the CMP process by process factors such as the platen or carrier speed of the polisher, the downpressure, and the pad type, but more often, microscratches are caused by the presence of large particles in slurry whose size is several micrometers (1–10 nm).

Reasons for the occurrence of large particles are listed below:

1) Aggregation or agglomerization
2) Partial drying in a container
3) Temperature or pH change
4) Clogging or crusting in delivery and piping system Large particles which are caused by aggregation or agglomerization as in (1) can be lessened by the dispersion method and the extent of dispersion. Furthermore, the remaining large particles can be removed by filtration.

However large particle occurrence by reasons (2)–(4) are not easy to control, because occurrence does not relate to the dispersion method or its extent, but rather to the transportation, storage, and environmental changes.

After our extensive research, based on the thought that if large particles produced by uncontrollable factors could be removed or reduced, the microscratches on the polished surface after polishing would be minimized, the inventors of the present invention learned that polishing with minimal or no microscratches could be done by adding cyclic amine to the polishing composition.

The present invention is characterized by a polishing composition consisting of deionized water, metallic oxide powder, and cyclic amine.

Until now the research for CMP slurry has related to improving the removal rate or selectivity. The present invention focuses on minimizing microscratches after polishing.

DETAILED DESCRIPTION OF THE PREFERRED EMBODIMENTS

According to the present invention, a polishing composition consisting of 30–99 wt % of deionized water, 0.1–50 wt % metallic oxide powder, and 0.01–20 wt % of cyclic amine is provided.

The metallic oxides that can be used in the present invention are Silica($SiO_2$), Alumina($Al_2O_3$), Ceria($CeO_2$), Zirconia($ZrO_2$), and Titania($TiO_2$) which are made by a fuming method or the Sol-Gel method.

The primary particle size of these metallic oxides is between 10–100 nm, with an optimum size of 20–60 nm. A primary particle smaller than 10 nm is not favorable in view of throughput because of the dramatic decrease in the removal rate. A primary particle larger than 100 nm is favorable because of the high removal rate, but it causes a lot of microscratches, which is a problem.

These metallic oxides in an aqueous dispersion solution form secondary particles, whose size is ideally 20–250 nm.

As well the maximum size of the secondary particles ideally should be smaller than 500 nm, as particles larger than 500 nm may cause settling problems. The larger the mean and maximum particles are, the greater the decrease in settling stability. If left at room temperature for over one week, settling will occurs, which is a problem.

The contents of the metallic oxides in the polishing composition are 0.1–50 wt %, and ideally 1–25 wt % to the total amount of slurry. Usually the contents of the metallic oxides in the silica slurry for polishing the oxide insulating layer in the CMP process are 9–15 wt %, and for polishing the metal lines or plugs are 3–6 wt %.

The cyclic amines which are used as essential additives in this inventive polishing composition are 2-pyrrolidinone, pyrrolidine, 3-pyrrolidinol, 3-pyrroline, methyl-2-oxo-1-pyrrolidine acetate, N-methyl pyrrolidinone, and N-methyl pyrrolidine.

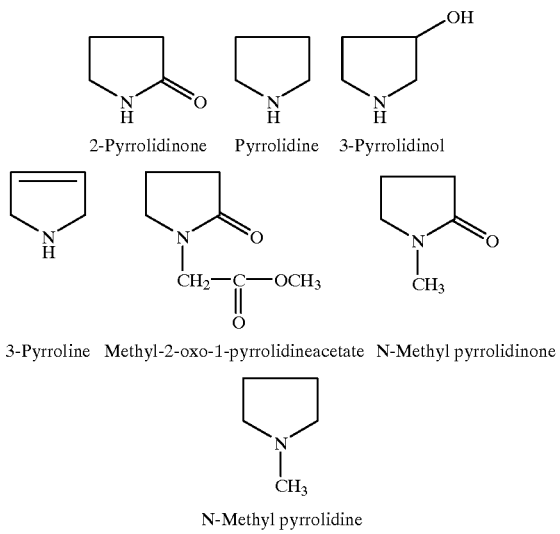

The contents of this cyclic amine are 0.01–20 wt %, preferably 0.05–10 wt % to the total amount of polishing composition.

If the contents are too small, a reduction in microscratches by using this inventive polishing composition can not be expected.

If the contents are too large, the effect of the cyclic amine will remain the same, but the production costs will increase, so economically it is not favorably.

These additives can be used alone or mixed with different cyclic amines.

Although it is difficult to explain the specific reason for the decrease in microscratches by adding the cyclic amines, it is believed that it comes from the reasons given below.

From the basic knowledge that cyclc amines have humectant properties, it is possible to derive that:

1) they protect metallic oxides from aggergating and agglomerating
2) they protect metallic oxides from clogging or crusting in transportation and storage, and in the delivery/piping system.

Therefore the likelihoood of of large particle occurrence is suppressed.

These additives can be added before or after dispersing the metallic oxides in deionized water. Also, when added to commercially-sold slurries the same effects can be expected.

In addition, these additives increase the slurry settling stability. Usually settling problems occurs when slurry is stored for a long time, but when the cyclic amine is added to the slurry, this problem does not occur because this additive enhances slurry dispersion.

Also, during the manufacturing of slurry, cyclic amine additives prevent the slurry from reaching thixotropy, which is a sudden increase in viscosity, so these additives actually make the manufacturing of slurry much easier.

A second additive is added to the polishing composition of the present invention according to the kinds of materials to be polished. For example, this inventive polishing composition is used with a base such as KOH, or ammonium salts for polishing the oxide insulating layer, and an acid such as $H_2SO_4$, $HNO_3$, or $CH_3COOH$ and an oxidizing agent for polishing the metal lines and the plugs.

Using examples given below, the present invention can be better understood. These are just a few of the examples that illustrate this invention's diverse capabilities. This invention is by no means confined to just the following examples.

EXAMPLE 1

A polishing composition was prepared by the following method.

100 g of commercial Aerosil 200 (Degussa corp.), 18 g of 20%-KOH solution, and 860 g of deionized water were mixed in 2 L polyethylene flask for 2 hours at 1000 rpm. 10 g of 2-pyrrolidinone (1 wt %) was added to the mixed slurry. The slurry was then dispersed by batchtype dynomill with 500 g of 2 mm glass beads for 1 hour and then filtered with a 1 μm depth filter.

This polishing composition was used to polish samples of CVD-deposited PE-TEOS tilm on silicone substrate. (The polishing conditions are given below.)

The removal rate was evaluated from the remaining thickness of the film and the number of microscratches was measured by KLA wafer defect inspection system. The results are shown in table 1.

The polishing conditions were as follows:
Polisher: 6EC (Strasbaugh)
Pad type: IC1000 /Suba IV stacked (Rodel)
Platen speed: 120 rpm
Carrier speed: 120 rpm
Down force: 6 psi
Back pressure: 0 psi
Temperature: 25° C.
Slurry flow: 150 ml/min

EXAMPLES 2–7

The slurry was manufactured by the same method as in example 1 except that other cyclic amines specified in Table 1 were added instead of 2-pyrrolidinone. The polishing capacity was evaluated, and the results are indicated in Table 1.

EXAMPLES 8–11

The slurry was manufactured by the same method as in example 1 except that other metallic oxides specified in Table 1 were used instead of fumed silica, and the pH level was controlled after dispersion.

The polishing capacity was evaluated and the results are indicated in Table 1.

EXAMPLES 12–14

The polishing capacity was evaluated after storing the slurry manufactured by the same method as in example 1 for one day (example 12), seven days (example 13) and thirty days (example 14), respectively.

The results are indicated in Table 3.

Comparative Example 1

The slurry was manufactured by the same method as in example 1 except that 2-pyrrolidinone was not added to the slurry. The polishing capacity was evaluated and the results are indicated in Table 2.

Comparative Example 2

The slurry was manufactured by the same method as in example 8 except that 2-pyrrolidinone was not added to the slurry, and the polishing capacity was evaluated and the results are indicated in Table 2.

Comparative Example 3

The slurry was manufactured by the same method as in example 9 except that 2-pyrrolidinone was not added to the slurry, and the polishing capacity was evaluated and the results are indicated in Table 2.

Comparative Example 4

The slurry was manufactured by the same method as in example 10 except that 2-pyrrolidinone was not added to the slurry, and the polishing capacity was evaluated and the results are indicated in Table 2.

Comparative Example 5

The slurry was manufactured by the same method as in example 11 except that 2-pyrrolidinone was not added to the slurry, and the polishing capacity was evaluated and the results are indicated in Table 2.

Comparative Examples 6–8

The polishing capacity was evaluated after storing the slurry which was manufactured by the same method as in example 12–14 except that 2-pyrrolidinone was not added to the slurry for one day (comparative example 6), seven days (comparative example 7) and thirty days (comparative example 8), respectively. The results are indicated in Table 3.

TABLE 1

| | Metallic Oxide | Additive | pH | Polishing Capability Removal Rate (Å/min) | micro-scratches (EA/wafer) |
|---|---|---|---|---|---|
| Example 1 | Silica ($SiO_2$) | 2-pyrrolidinone | 11 | 3,263 | 3 |
| Example 2 | Silica ($SiO_2$) | Pyrrolidine | 11 | 3,372 | 0 |
| Example 3 | Silica ($SiO_2$) | 3-Pyrrolidinol | 11 | 3,207 | 2 |
| Example 4 | Silica ($SiO_2$) | 3-Pyrroline | 11 | 3,235 | 4 |
| Example 5 | Silica ($SiO_2$) | Methyl-2-oxo-1-pyrrolidine Acetate | 11 | 3,217 | 7 |
| Example 6 | Silica ($SiO_2$) | N-Methyl Pyrrolidinone | 11 | 3,310 | 5 |
| Example 7 | Silica ($SiO_2$) | N-Methyl Pyrrolidine | 11 | 3,189 | 3 |
| Example 8 | Alumina ($Al_2O_3$) | 2-Pyrrolidinone | 9 | 4,280 | 32 |
| Example 9 | Ceria ($CeO_2$) | 2-Pyrrolidinone | 4 | 4,826 | 15 |
| Example 10 | Zirconia ($ZrO_2$) | 2-Pyrrolidinone | 7 | 4,327 | 17 |
| Example 11 | Titania ($TiO_2$) | 2-Pyrrolidinone | 10 | 3,977 | 20 |

TABLE 2

| | Metallic Oxide | Additive | pH | Polishing Capability Removal Rate (Å/min) | Microscratches (EA./wafer) |
|---|---|---|---|---|---|
| Comparative Example 1 | Silica ($SiO_2$) | Not added | 11 | 3,309 | 82 |
| Comparative Example 2 | Alumina ($Al_2O_3$) | Not added | 9 | 4,277 | 150 |
| Comparative Example 3 | Ceria ($CeO_2$) | Not added | 4 | 4,820 | 167 |
| Comparative Example 4 | Zirconia ($ZrO_2$) | Not added | 7 | 4,290 | 272 |
| Comparative Example 5 | Titania ($TiO_2$) | Not added | 10 | 3,955 | 290 |

TABLE 3

| | Metallic Oxide | Additive | pH | Polishing Capability Removal Rate (Å/min) | microscratches (EA/wafer) |
|---|---|---|---|---|---|
| Example 12 | Silica ($SiO_2$) | 2-Pyrrolidinone | 11 | 3,372 | 0 |
| Example 13 | Silica ($SiO_2$) | 2-Pyrrolidinone | 11 | 3,391 | 3 |
| Example 14 | Silica ($SiO_2$) | 2-Pyrrolidinone | 11 | 3,359 | 3 |
| Comparative Example 6 | Silica ($SiO_2$) | Not added | 11 | 3,309 | 82 |
| Comparative Example 7 | Silica ($SiO_2$) | Not added | 11 | 3,327 | 182 |
| Comparative Example 8 | Silica ($SiO_2$) | Not added | 11 | 3,320 | 596 |

The polishing composition obtained according to the present invention has an effect that it does not cause microscratches on the polished surface. Thereby it can be applied to the CMP process in the manufacturing process of highly integrated circuits such as Shallow Trench Isolation.

What is claimed is:

1. A polishing composition consisting of 30–99 wt % of deionized water, 0.1–50 wt % of metallic oxide in the form of powder, and 0.01–20 wt % of cyclic amine, wherein said cyclic amine is at least one selected from the group of 2-pyrrolidinone, pyrrolidine, 3-pyrrolidinol, 3-pyrroline, methyl-2-oxo-1-pyrrolidine acetate, N-methyl pyrrolidinone, and N-methyl pyrrolidine.

2. The polishing composition according to claim 1, wherein said metallic oxide is at least one selected from the group of silica($SiO_2$), alumina($Al_2O_3$), ceria($CeO_2$), zirconia($ZrO_2$), and titania($TiO_2$).

3. The polishing composition according to claim 1 or 2, wherein the size of the average particles of said metallic oxide is 10–100 nm.

4. The polishing composition according to claim 1, wherein said metallic oxide is silica($SiO_2$).

* * * * *